(12) United States Patent
Rolston

(10) Patent No.: US 10,877,231 B2
(45) Date of Patent: Dec. 29, 2020

(54) WIREBONDING FOR SIDE-PACKAGED OPTICAL ENGINE

(71) Applicant: REFLEX PHOTONICS INC., Kirkland (CA)

(72) Inventor: David Robert Cameron Rolston, Beaconsfield (CA)

(73) Assignee: REFLEX PHOTONICS INC., Kirkland (CA)

( * ) Notice: Subject to any disclaimer, the term of this patent is extended or adjusted under 35 U.S.C. 154(b) by 0 days.

(21) Appl. No.: 16/484,688

(22) PCT Filed: Feb. 26, 2018

(86) PCT No.: PCT/CA2018/050219
§ 371 (c)(1),
(2) Date: Aug. 8, 2019

(87) PCT Pub. No.: WO2018/152647
PCT Pub. Date: Aug. 30, 2018

(65) Prior Publication Data
US 2020/0003968 A1    Jan. 2, 2020

Related U.S. Application Data

(60) Provisional application No. 62/463,347, filed on Feb. 24, 2017.

(51) Int. Cl.
*H01L 23/00* (2006.01)
*G02B 6/42* (2006.01)

(52) U.S. Cl.
CPC .......... *G02B 6/428* (2013.01); *G02B 6/4249* (2013.01); *G02B 6/4292* (2013.01); *H01L 24/06* (2013.01); *H01L 2224/4809* (2013.01)

(58) Field of Classification Search
CPC ............... H01L 2224/48227–48233; H01L 2224/48153–48155; H01L 24/06;
(Continued)

(56) References Cited

U.S. PATENT DOCUMENTS 5,043,775 A * 8/1991 Lee ................... H01L 31/03529
257/433
5,249,245 A * 9/1993 Lebby .................. G02B 6/4249
257/E23.177
(Continued)

FOREIGN PATENT DOCUMENTS

WO    WO2005010580    2/2005

OTHER PUBLICATIONS

International Search Report and Written Opinion dated May 24, 2018 in connection with International Patent Application No. PCT/CA2018/050219.

*Primary Examiner* — Bitew A Dinke
(74) *Attorney, Agent, or Firm* — Norton Rose Fulbright Canada LLP

(57) ABSTRACT

The present disclosure is drawn to wirebonding for optical engines having side-mounted optoelectronic components. An integrated circuit is mounted on a first surface of a substrate block, and an optoelectronic component is positioned on a second surface of the substrate block and is oriented to emit light in a direction parallel to a plane defined by the first surface. A wirebond is drawn between the integrated circuit and a base substrate on which the substrate block is mounted. A optoelectronic component is then contacted with the wirebond, and a portion of the wirebond between the optoelectronic component and the base substrate is removed.

8 Claims, 11 Drawing Sheets

(58) Field of Classification Search
CPC ........... H01L 2224/4809; H01L 25/042; H01L 25/167; H01L 25/16–18; H01L 2224/481–4824; H01L 24/44–49; G02B 6/428; G02B 6/4249; G02B 6/4292; G02B 6/4274; G02B 6/3885; G02B 6/4201–4218; H01K 5/00

See application file for complete search history.

(56) References Cited

U.S. PATENT DOCUMENTS

| | | | | |
|---|---|---|---|---|
| 8,618,664 | B2* | 12/2013 | Lin | H01L 24/49 257/773 |
| 2005/0121820 | A1 | 6/2005 | Rolston et al. | |
| 2006/0216863 | A1* | 9/2006 | Arakawa | H01L 24/85 438/118 |
| 2006/0227587 | A1* | 10/2006 | Nakamura | G11C 5/063 365/63 |
| 2007/0183718 | A1* | 8/2007 | Bae | G02B 6/12004 385/47 |
| 2007/0258683 | A1 | 11/2007 | Rolston et al. | |
| 2010/0035380 | A1* | 2/2010 | Li | H01L 24/78 438/107 |
| 2010/0272388 | A1* | 10/2010 | Im | G02B 6/4249 385/14 |
| 2012/0286427 | A1* | 11/2012 | Sumitomo | H01L 24/05 257/738 |
| 2013/0177281 | A1* | 7/2013 | Kosenko | G02B 6/4214 385/89 |
| 2013/0200514 | A1* | 8/2013 | Kim | H01L 25/0657 257/737 |
| 2013/0286676 | A1* | 10/2013 | Kim | G02B 6/46 362/553 |
| 2015/0008552 | A1* | 1/2015 | Matsusue | H01S 5/02248 257/431 |
| 2015/0023632 | A1* | 1/2015 | Lan | G02B 6/4214 385/14 |
| 2015/0271921 | A1* | 9/2015 | Hu | H05K 3/366 361/792 |
| 2017/0040305 | A1* | 2/2017 | Kugiyama | H01L 31/167 |
| 2018/0310403 | A1* | 10/2018 | Albertson | H05K 1/112 |
| 2020/0126947 | A1* | 4/2020 | Karasawa | H01L 25/50 |

* cited by examiner

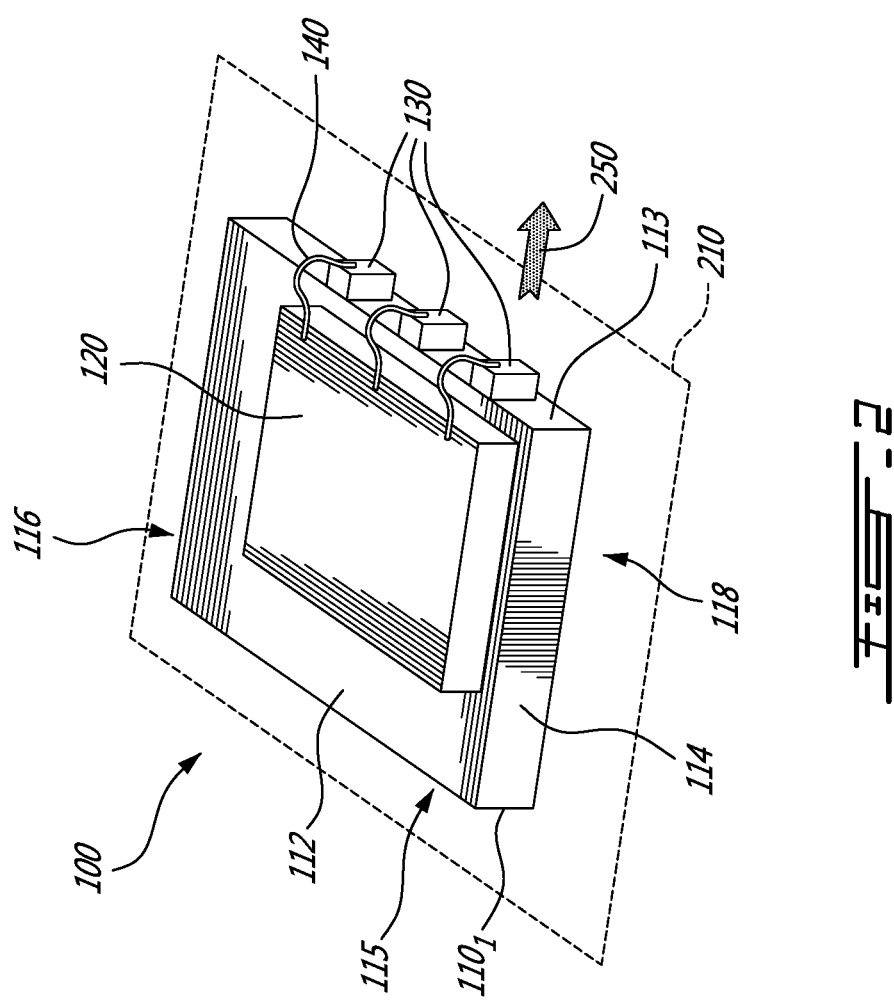

```
                                      ┌──────────────────────────────────────────────┐
                                      │  Mounting an integrated circuit on a first   │
                                      │  surface of a substrate block                │──302
                                      └──────────────────────────────────────────────┘
                                                             │
                                                             ▼
                                      ┌──────────────────────────────────────────────┐
                                      │  Positioning an optoelectronic component on  │
                                      │  a second surface of the substrate block,    │
                                      │  the optoelectronic component oriented to    │──304
                                      │  emit light in a direction parallel to plane │
                                      │  defined by the first surface                │
                                      └──────────────────────────────────────────────┘
                                                             │
                                                             ▼
```

300

Mounting an integrated circuit on a first surface of a substrate block — 302

Positioning an optoelectronic component on a second surface of the substrate block, the optoelectronic component oriented to emit light in a direction parallel to plane defined by the first surface — 304

Drawing a wirebond between the integrated circuit and a base substrate, the wirebond having a first end at the integrated circuit and a second end at the base substrate — 306

Contacting the optoelectronic component with the wirebond at a point intermediate the first and second ends of the wirebond — 308

Removing a portion of the wirebond between the optoelectronic component and the base substrate — 310

FIG. 3

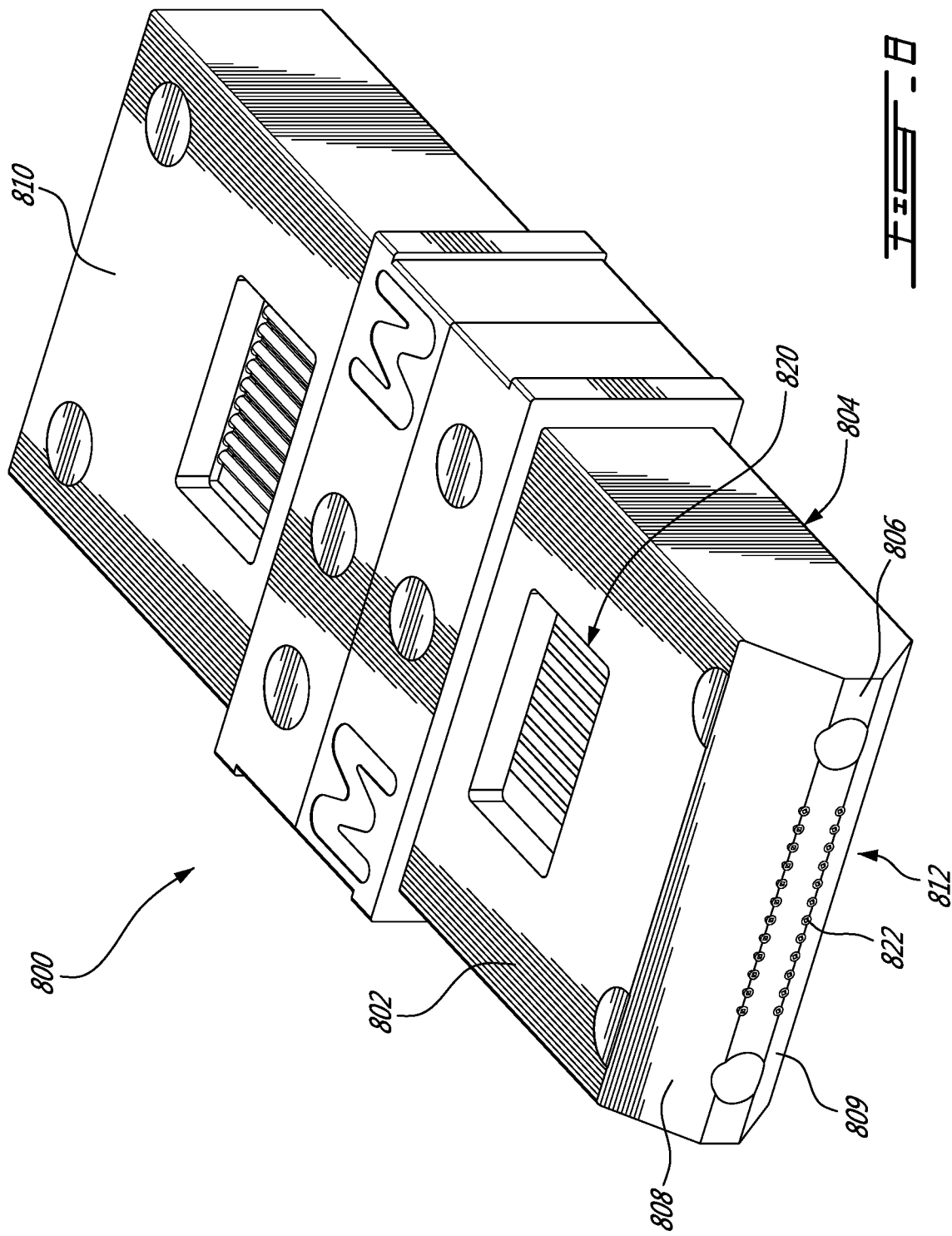

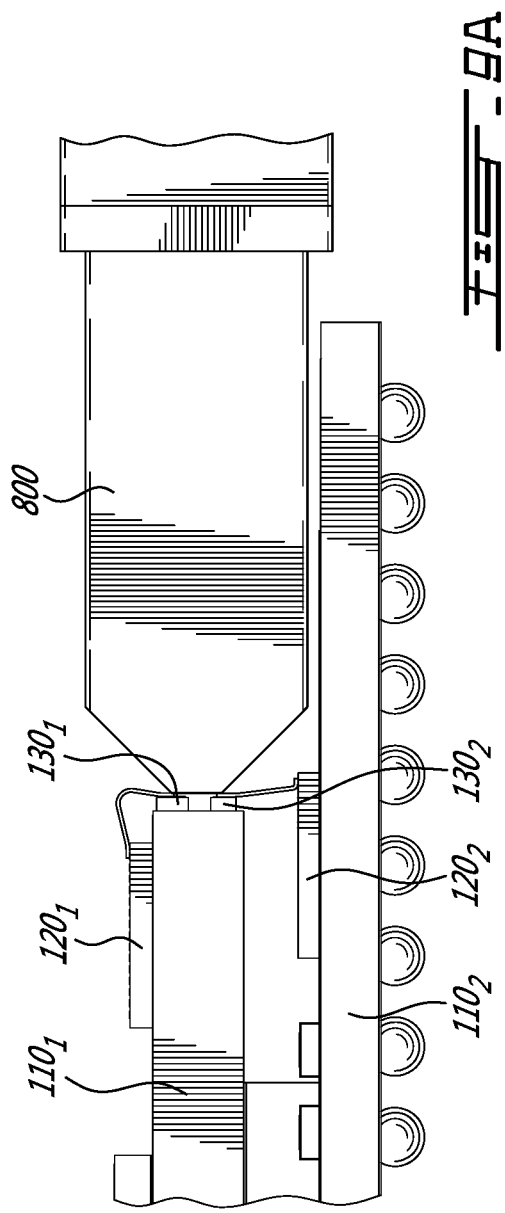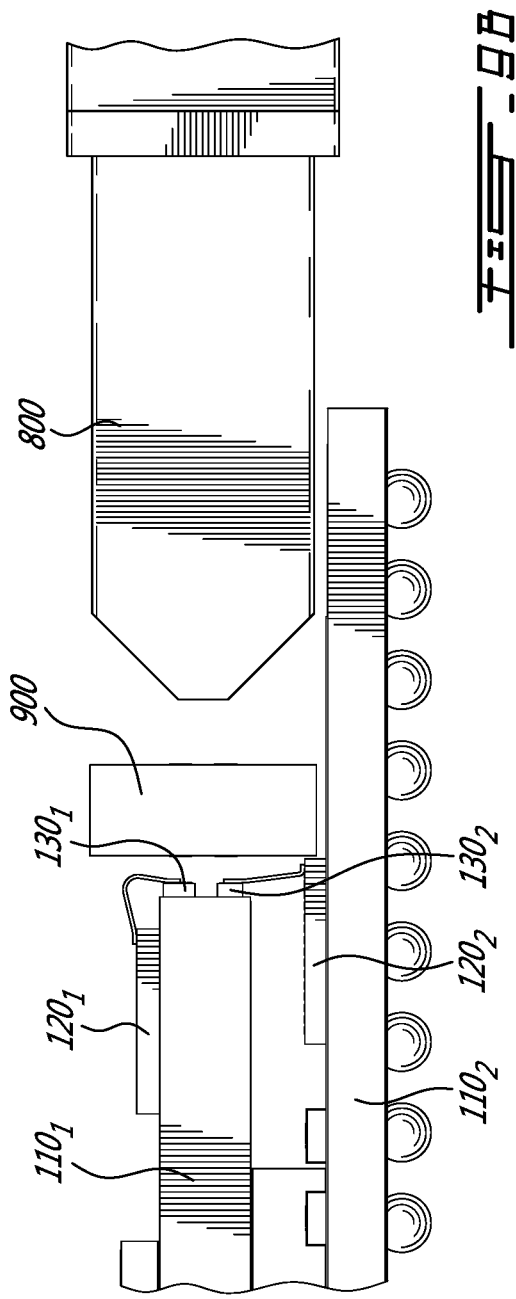

WIREBONDING FOR SIDE-PACKAGED OPTICAL ENGINE

CROSS-REFERENCE TO RELATED APPLICATIONS

This patent application claims priority of U.S. provisional Application Ser. No. 62/463,347, filed on Feb. 24, 2017.

TECHNICAL FIELD

The present disclosure relates to laser-light producing or detecting devices, and more specifically to the wirebonding of laser or detector components in laser-light producing or detecting devices.

BACKGROUND OF THE ART

Optical communication relies on the ability to generate, transmit, and detect light-based signals. Modern optical communication, performed via fiber optics, uses modulated laser-based signals to transmit information. The laser-based signals are produced by optical engines, and then transmitted over a network of fiber optic cabling. The laser-based signals can then be modulated, amplified, and ultimately detected via suitable hardware and software components.

To build an optical engine using semiconductor technology, an integrated circuit is mounted on a substrate, such as a printed circuit board, with one or more light-generating or light-receiving components (collectively optoelectronic components) positioned on the substrate. The integrated circuit is connected to the optoelectronic components to control their operation, allowing the optoelectronic components to either generate or receive optical signals to relay information. However, it may be challenging to couple light to or from the optoelectronic components into the fiber optic cabling due to the physical and/or geometric restrictions imposed by the setup.

The primary physical geometry for most standard optical modules generally requires that the emitted or detected light, by way of optical fibers and an optical connector, depart from or arrive at the optoelectronic components in a direction parallel to the substrate. However, the optoelectronic components, along with most of all other components placed on the substrate are placed on a surface of the card normal to the direction of an optical path along which the emitted or detected light travels. The physical direction of the optical signals parallel to the card therefore necessitates a 90-degree change in the plane of the emitting or detecting element inside the optical module or a reflective change in direction of the optical signal if the emitting or detecting element is kept normal to the plane of the card. Improvements are thus desired.

SUMMARY

The present disclosure is drawn to wirebonding for optical engines having side-mounted optoelectronic components. An integrated circuit is mounted on a first surface of a substrate block, and an optoelectronic component is positioned on a second surface of the substrate block and is oriented to emit or detect light in a direction parallel to a plane defined by the first surface. A wirebond is drawn between the integrated circuit and a base substrate on which the substrate block is mounted. An optoelectronic component is then contacted with the wirebond, and a portion of the wirebond between the optoelectronic component and the base substrate is removed.

In accordance with a broad aspect, there is provided a method for electrically coupling an optoelectronic component to an integrated circuit mounted on a first surface of a substrate block, comprising drawing a wirebond between the integrated circuit and a base substrate on which the substrate block is mounted, the wirebond having a first end at the integrated circuit and a second end at the base substrate; contacting the optoelectronic component, positioned on a second surface of the substrate block, with the wirebond at a point intermediate the first and second ends of the wirebond, the second surface being adjacent to the first surface, the optoelectronic component oriented to emit light in a direction parallel to a plane defined by the first surface; and removing a portion of the wirebond between the optoelectronic component and the base substrate.

In some embodiments, the method further comprises positioning the optoelectronic component on the second surface of the substrate block.

In some embodiments, contacting the optoelectronic component comprises heating the wirebond to couple the wirebond to the optoelectronic component.

In some embodiments, contacting the optoelectronic component comprises performing ultrasonic vibrational welding to couple the wirebond to the optoelectronic component.

In some embodiments, contacting the optoelectronic component comprises compressing the wirebond into a contact pad of the optoelectronic component to couple the wirebond to the optoelectronic component.

In some embodiments, removing the wirebond portion comprises forcibly breaking the wirebond portion by applying a mechanical force to the wirebond portion.

In some embodiments, applying a mechanical force to the wirebond portion comprises cutting the wirebond portion.

In some embodiments, positioning the optoelectronic component further comprises bonding the optoelectronic component to the substrate.

In accordance with another broad aspect, there is provided a wirebonding system, comprising: a wirebonder; a processing unit configured for controlling operation of the wirebonder; and a non-transitory memory communicatively coupled to the processing unit and comprising computer-readable program instructions executable by the processing unit to control operation of the wirebonder for: drawing a wirebond between an integrated circuit and a base substrate, the integrated circuit being mounted on a first surface of a substrate block, the substrate block being mounted on the base substrate, the wirebond having a first end at the integrated circuit and a second end at the base substrate; contacting an optoelectronic component with the wirebond at a point intermediate the first and second ends of the wirebond, the optoelectronic component positioned on a second surface of the substrate block adjacent to the first surface and oriented to emit light in a direction parallel to a plane defined by the first surface; and removing a portion of the wirebond between the optoelectronic component and the base substrate.

In some embodiments, contacting the optoelectronic component comprises heating the wirebond to couple the wirebond to the optoelectronic component.

In some embodiments, contacting the optoelectronic component comprises compressing the wirebond into a contact pad of the optoelectronic component to couple the wirebond to the optoelectronic component.

In accordance with another broad aspect, there is provided an optical system assembly, comprising: an optical engine and an optical fiber coupler connected to the optical engine. The optical engine comprises a substrate having interconnected side surfaces and having mounted thereon at least one integrated circuit; and at least one optoelectronic component mounted on one of the side surfaces of the substrate, the at least one optoelectronic component coupled to the integrated circuit via a wirebond. The optical fiber coupler comprises upper and lower planar surfaces; a front face between the upper and lower planar surfaces defining at least one aperture containing an optical fiber, the at least one aperture positioned opposite to the at least one optoelectronic component of the optical engine and aligned therewith within a predetermined tolerance; and a chamfer surface extending between the upper planar surface and the front face and providing a line-of-sight from the upper planar surface to the front face.

In some embodiments, the chamfer surface is at an angle of 45° with respect to the upper surface.

Features of the systems, devices, and methods described herein may be used in various combinations, and may also be used for the system and computer-readable storage medium in various combinations

BRIEF DESCRIPTION OF THE DRAWINGS

Further features and advantages of embodiments described herein may become apparent from the following detailed description, taken in combination with the appended drawings, in which:

FIG. 2 is a simplified perspective view of the example optical engine of FIG. 1.

FIG. 3 is a flowchart illustrating a method for electrically coupling an optoelectronic component to an integrated circuit according to an embodiment.

FIG. 8 a perspective view of an example optical fiber coupler.

FIGS. 9A-B are side-views of example coupling of the optical engine of FIG. 6G to an optical fiber coupler.

It will be noted that throughout the appended drawings, like features are identified by like reference numerals.

DETAILED DESCRIPTION

There is described herein a method for connecting an integrated circuit and an optoelectronic component using wirebonding. In the prior art, the method can involve a very complicated kinematic, gimbaled mount inside a wirebonding machine where the part is rotated and moved between the first and second bond attach. Instead, there is described herein a simplified, two-step method. The method comprises having one or more wirebonds fully attached in one plane, and then the entire part is re-placed in a second orientation so that a bond-and-cut operation on the wirebond can be made by attaching a new portion of the wirebond to a new location on the second plane. This is followed by a third action to remove the unrequired portion of the wirebond.

Figure 1:
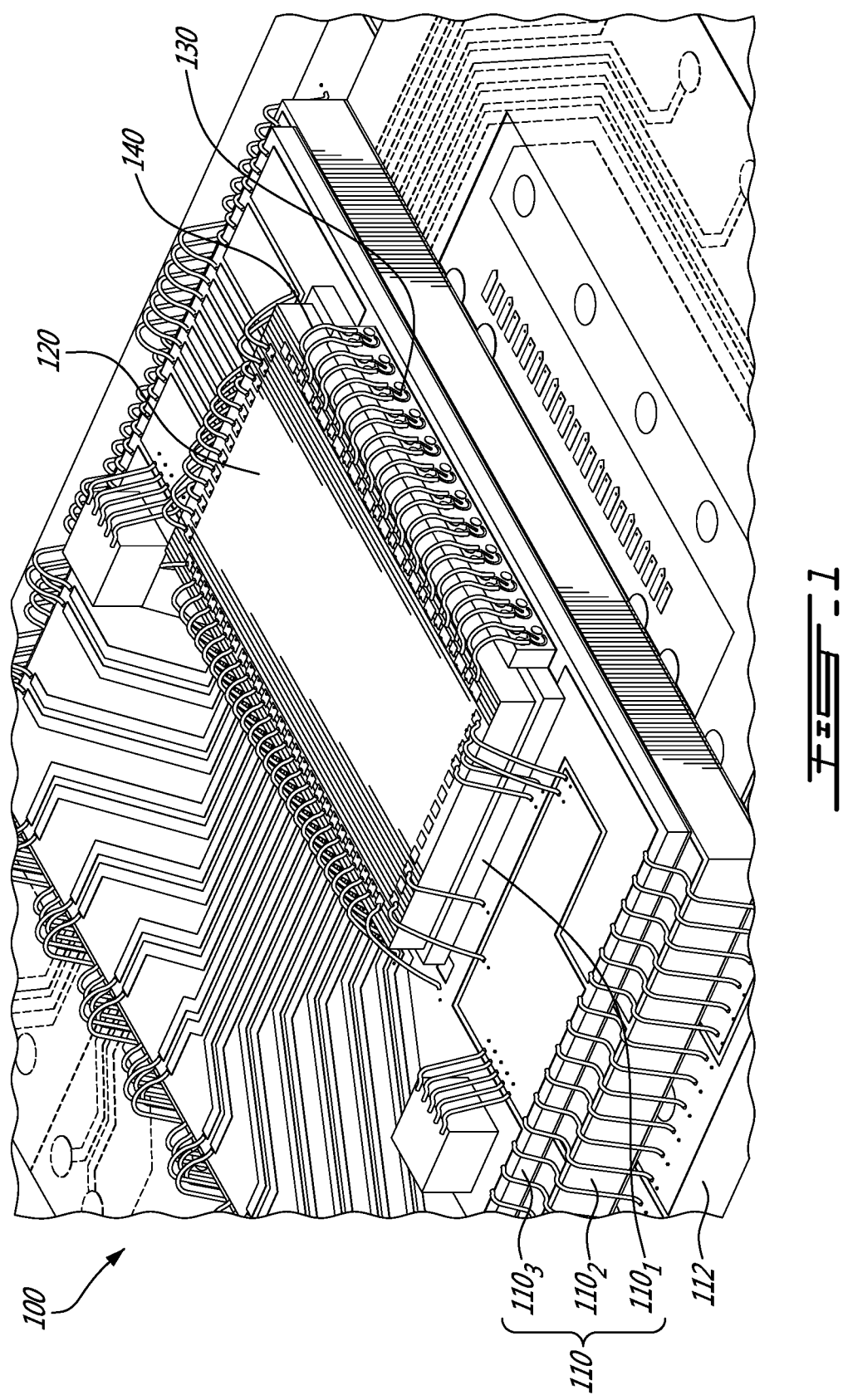
FIG. 1 is a perspective view of an optical engine according to an embodiment.

With reference to FIG. 1, there is shown an optical engine 100 configured to produce laser light, for example a laser-based optical signal. The optical engine 100 comprises at least one substrate block 110, an integrated circuit 120, a plurality of optoelectronic components 130, and a plurality of wirebonds 140. The optical engine 100 is implemented on a base substrate 112, for example a printed circuit board or other suitable base.

In this embodiment of the optical engine 100, the at least one substrate block 110 comprises a plurality of substrate blocks $110_1$, $110_2$, $110_3$. Other embodiments of the optical engine 100 can include more, or fewer substrate blocks 110, as appropriate. The substrate blocks 110 may be made of any suitable material, and may be any suitable type of substrate, including printed circuit boards, plastic substrates, ceramic substrates, and the like. The substrate blocks 110 may be stacked or otherwise superimposed in any suitable way on the base substrate 112.

The integrated circuit 120 may be any suitable processing device for controlling laser light generation of the optoelectronic components 130. In certain embodiments, the integrated circuit 120 is a microcontroller, laser driver circuit, or other suitable control device. The integrated circuit 120 is mounted on the at least one substrate block 110. The integrated circuit 120 may be mounted in any suitable way, for example via a ball-grid array, spider connectors, laser-welding of the chip on a gold or ceramic mount, a conductive bonding epoxy, or any other suitable mounting mechanism which provides access to the electrical connections using a wirebonder. In certain embodiments, the integrated circuit 120 is also wirebonded to one or more of the substrate blocks 110. In certain embodiments, the optical engine 100 includes a plurality of integrated circuits 120 disposed in any suitable fashion—for simplicity of explanation, the embodiments described herein will reference only a single integrated circuit 120.

The optoelectronic components 130 may be any suitable light-generating or detecting components, including any suitable kind of semiconductor laser or photodetector. In certain embodiments, the optoelectronic components 130 are vertical cavity surface emitting laser (VCSEL). Although the embodiment depicted in FIG. 1 shows a plurality of optoelectronic components 130, it should be noted that other embodiments may have more or fewer optoelectronic components 130. In certain embodiments, the optical engine 100 includes one optoelectronic component 130. The optoelectronic components 130 are positioned on the substrate block $110_1$ and can be mounted in any suitable fashion and using any suitable mounting techniques, for example laser welding or conductive epoxy. As described in greater detail hereinbelow, the optoelectronic components 130 are mounted on a different surface of the at least one substrate block 110 than the integrated circuit 120.

Additionally, the wirebonds 140 are provided between the optoelectronic components 130 and the integrated circuit 120 to electrically couple the integrated circuit 120 to the optoelectronic components 130. The wirebonds 140 make connections which electrically couple the optoelectronic components 130 and the integrated circuit 120. More specifically, the wirebonds 140 are wires of gold or other metallic material created by a wirebonding process.

With reference to FIG. 2, an embodiment of the optical engine 100 having only substrate block $110_1$ is shown. Substrate block $110_1$ has a plurality of surfaces which are connected to one-another. In particular, substrate block $110_1$ has six interconnected surfaces: a first surface 112, a second surface 113, a third surface 114, a fourth surface 115, a fifth surface 116, and a sixth surface 118. In this embodiment, the substrate block $110_1$ is shaped as a rectangular prism. In other embodiments, the substrate blocks 110 can take on any other suitable shape, having any suitable number of interconnected surfaces.

Surface 112 defines a plane 210. The other surfaces of the substrate block $110_1$ may be perpendicular to plane 210, parallel to plane 210, or be disposed at any other suitable angle relative to plane 210. For example, surface 118 is parallel to plane 210, and surfaces 113, 114, 115, and 116 are perpendicular to plane 210.

In this embodiment, the integrated circuit 120 is mounted on the first surface 112, and the optoelectronic components 130 are positioned on the second surface 113, which is adjacent to the first surface 112. In particular, the optoelectronic components 130 are positioned on the second surface 113 of the substrate block $110_1$ and oriented to emit laser light in a direction parallel to the plane 210 defined by the first surface 112 of the substrate block $110_1$. For example, the direction of laser light produced by the optoelectronic components 130 is shown by arrow 250. This can be accomplished, for example, by aligning a laser-light emitting side of the optoelectronic components 130 perpendicular to plane 210.

With reference to FIG. 3, an example wirebonding method 300 for electrically coupling a optoelectronic component to an integrated circuit, for example any one of the optoelectronic components 130 to the integrated circuit 120, is shown.

At step 302, optionally the integrated circuit 120 is mounted on a first surface of a substrate block, for example on surface 112 of substrate block $110_1$. The integrated circuit may be mounted in any suitable way, for example via a ball-grid array, spider connectors, or any other suitable mounting mechanism. Alternatively, in other embodiments the method 300 begins with the integrated circuit 120 already mounted on the substrate block $110_1$, and step 302 can be omitted. In certain embodiments of the method 300, step 302 is performed after step 304.

At step 304, optionally the optoelectronic component 130 is positioned on a second surface of the substrate block $110_1$, for example surface 113, and can be mounted thereto. The optoelectronic component 130 is oriented to emit or detect light in a direction parallel to a plane defined by the first surface 112, for example the plane 210. In certain embodiments, a plurality of optoelectronic components 130 are positioned on the second surface 113, each of which is oriented to emit or detect light in a direction parallel to plane 210. In some other embodiments, the optoelectronic component(s) 130 are positioned on another surface, for example surface 114, 115, or 116, each oriented to emit or detect light in a direction parallel to plane 210. Alternatively, in other embodiments the method 300 begins (???) with the optoelectronic component(s) 130 and/or the integrated circuit 120 already positioned on the surface 113 of the substrate block $110_1$, and the method 300 begins at step 306.

The optoelectronic components 130 may be disposed in any suitable arrangement. For example, the optoelectronic components 130 are mounted on the second surface 113 in a single row-like configuration, as shown in FIG. 1. Alternatively, the optoelectronic components 130 are mounted in a matrix configuration on the second surface 113. For example, the optoelectronic components are mounted in a 2-by-x configuration, i.e. two stacked rows, where x is any suitable integer. Still other arrangements of the optoelectronic components 130 are considered, including three or more stacked rows, clusters of varying size, and the like.

Figure 4A:
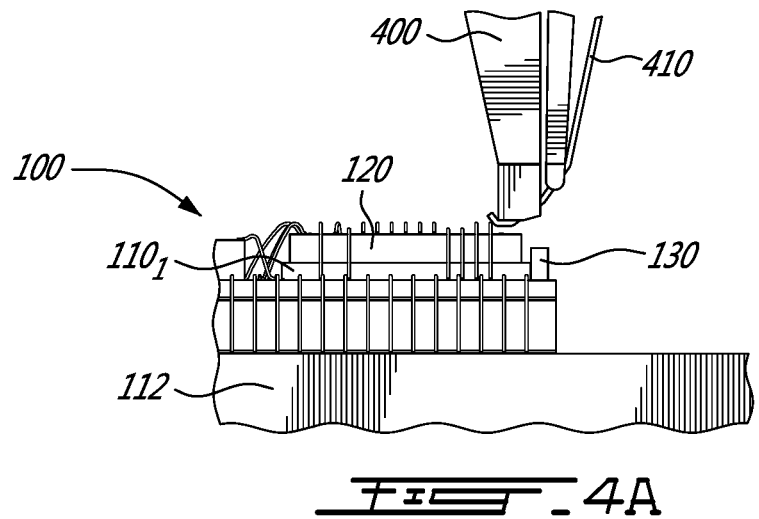
FIGS. 4A-G are side-views of example steps of the method of FIG. 3.
Figure 4B:
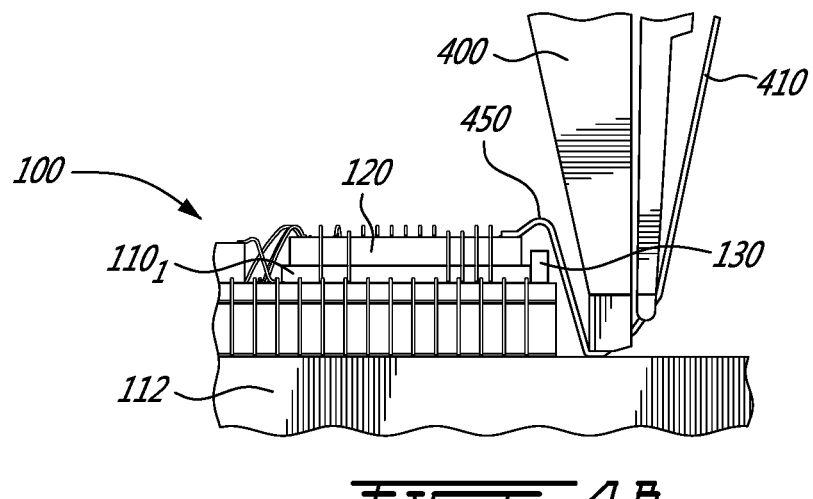
Figure 4C:
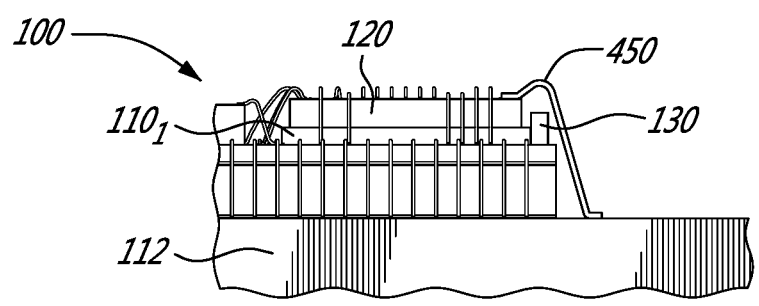

At step 306, a wirebond is drawn between the integrated circuit 120 and a base substrate, for example the base substrate 112, with the wirebond having a first end at the integrated circuit 120 and a second end at the base substrate 112. The first wirebond is completed with a standard wirebond machine to connect the first end and the second end of the wire to co-planar surfaces, with the wire passing in front of a perpendicular optoelectronic bonding pad (within tolerances). For example, and with reference to FIGS. 4A-C, a wirebonder 400 carries a wirebond thread 410. In FIG. 4A, the wirebonder 400 contacts the wirebond thread 410 with the integrated circuit 120. In FIG. 4B, the wirebonder 400 pulls the wirebond thread 410 to contact the base substrate 112, thus drawing the wirebond 350 between the integrated circuit 120 and the base substrate 112. In FIG. 4C, the wirebonder 400 cuts the wirebond thread 410 and is displaced, leaving the wirebond 450 having a first end at the integrated circuit 120 and a second end at the base substrate 112.

With continued reference to FIG. 3, at step 308, the optoelectronic component 130 is contacted with the wirebond 450 at a point intermediate the first and second ends of the wirebond 450. The module composed of the integrated circuit 120 and base substrate 112 may be repositioned to join the wirebond 450 to a new bonding point, using a wirebond wedge. By contacting the optoelectronic component 130 with the wirebond 450, the wirebond 450 becomes electrically coupled to the laser component 130, and by extension the optoelectronic component 130 becomes electrically coupled with both the integrated circuit 120 and the base substrate 112. For example, the wirebond 450 contacts a bond or contact pad (not illustrated) of the optoelectronic component 130, which causes the wirebond 450 to bond on the contact pad and electrically couples the integrated circuit 120, the optoelectronic component 130, and the base substrate 112. In certain embodiments, the optical engine 100 is subjected to a rotational motion prior to the implementation of step 308.

Figure 4D:
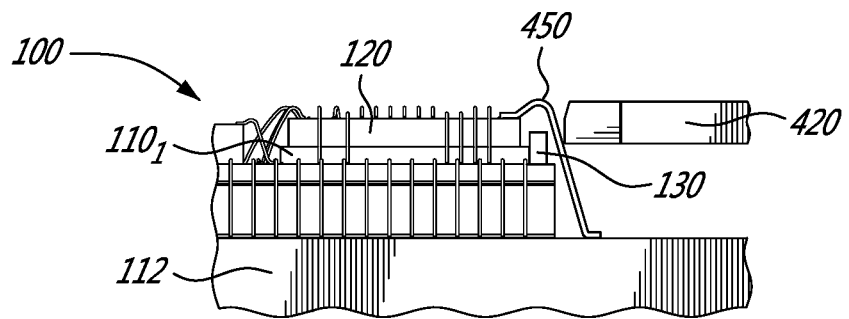
Figure 4E:
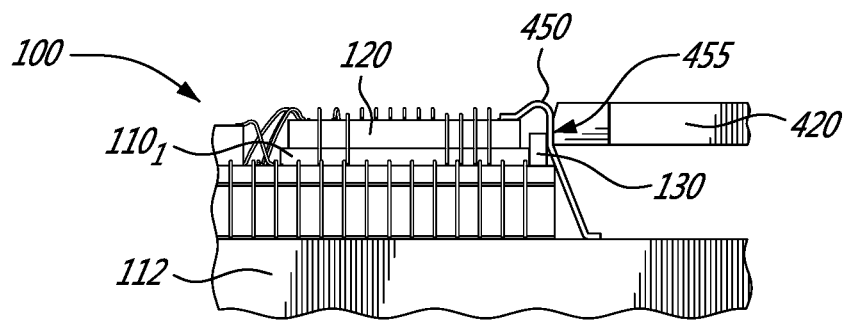

For example, and with reference to FIGS. 4D and 4E, a wirebond wedge 420 can be used to bond the optoelectronic component 130 with the wirebond 450. In FIG. 4D, the wirebond wedge 420 is brought into proximity with the wirebond 450 and with the optoelectronic components 130. In FIG. 4E, the wirebond wedge 420 pressures the wirebond 450 into contact with the contact pad of the optoelectronic component 130 at a bonding point 455 which is intermediate the first and second ends of the wirebond 450. In some embodiments, the wirebond wedge 420 can compress the wirebond 450 into the contact pad to facilitate removal of the portion of the wirebond 450 between the bonding point 455 and the base substrate 112. In certain embodiments, to ensure that the wirebond 450 bonds with, for example, a contact pad of the optoelectronic component 130, the wirebond wedge 420 is configured to additionally or alternatively apply ultrasonic energy to the wirebond 450 and/or to the contact pad of the optoelectronic component 130. In other embodiments, the pressure and/or ultrasonic energy can be applied to the wirebond 450 and/or the contact pad of the optoelectronic component 130 while the optical engine 100 is heated to a predetermined temperature. In other embodiments, the wirebond wedge 420 is configured to at least partially rupture the wire itself just after the bonding point 455 to allow for easier removal of a portion of the wirebond 450 between the optoelectronic component 130 and the base substrate 112, or to partially or substantially cut the wire at the bonding point 455.

Figure 4F:
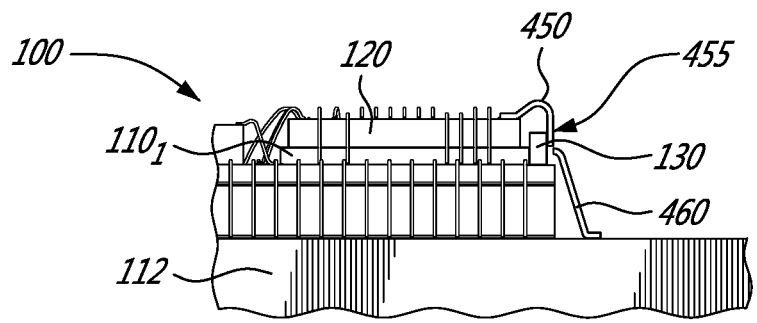
Figure 4G:
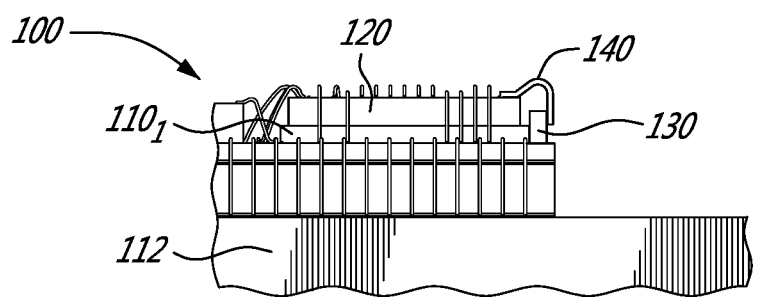

With continued reference to FIG. 3, at step 310 a portion 460 (or tail) of the wirebond 450 between the optoelectronic component 130 and the base substrate 112 is removed. This decouples the optoelectronic component 130 from the base substrate 112 but maintains the electrical coupling between the integrated circuit 120 and the optoelectronic components 130. For example, and with reference to FIG. 4F, a portion 460 between the point 455 and the base substrate 112 is removed. In some embodiments, the wirebond wedge 420 or a similar instrument can be used to cut or otherwise remove the portion 460, for instance by cutting the portion 460 near a bonding point with the base substrate 112. With reference to FIG. 4G, once the portion 460 is removed, the optical engine 100 is left only with wirebond 140, which connects the integrated circuit 120 to the optoelectronic component 130.

The removal of the portion 460 can be done in a variety of ways. For example, a mechanical force can be applied to the portion 460 to cause it to break at the point 455 and the substrate base 112. In some embodiments, the mechanical force is applied by the wirebond wedge 420, or other wedge structure that can deform the wire in a way to make it highly susceptible to breaking. In another example, the action of contacting the wirebond 450 with the wirebond wedge 420 causes the portion 460 to break away from the optoelectronic component 130. Still other methods of removing the portion 460 are considered.

Thus, the method 300 causes the optoelectronic components 130 to be electrically coupled to the integrated circuit 120 via the wirebond 140. Although the optoelectronic components 130 are positioned on a different surface of the substrate block $110_1$ than the integrated circuit 130, they can be electrically coupled by the wirebond 140. This allows the integrated circuit 120 to control operation of the optoelectronic components 130, which can emit or detect light in a direction parallel to the plane 210 defined by the first surface 112 of the substrate block $110_1$.

Figure 5:
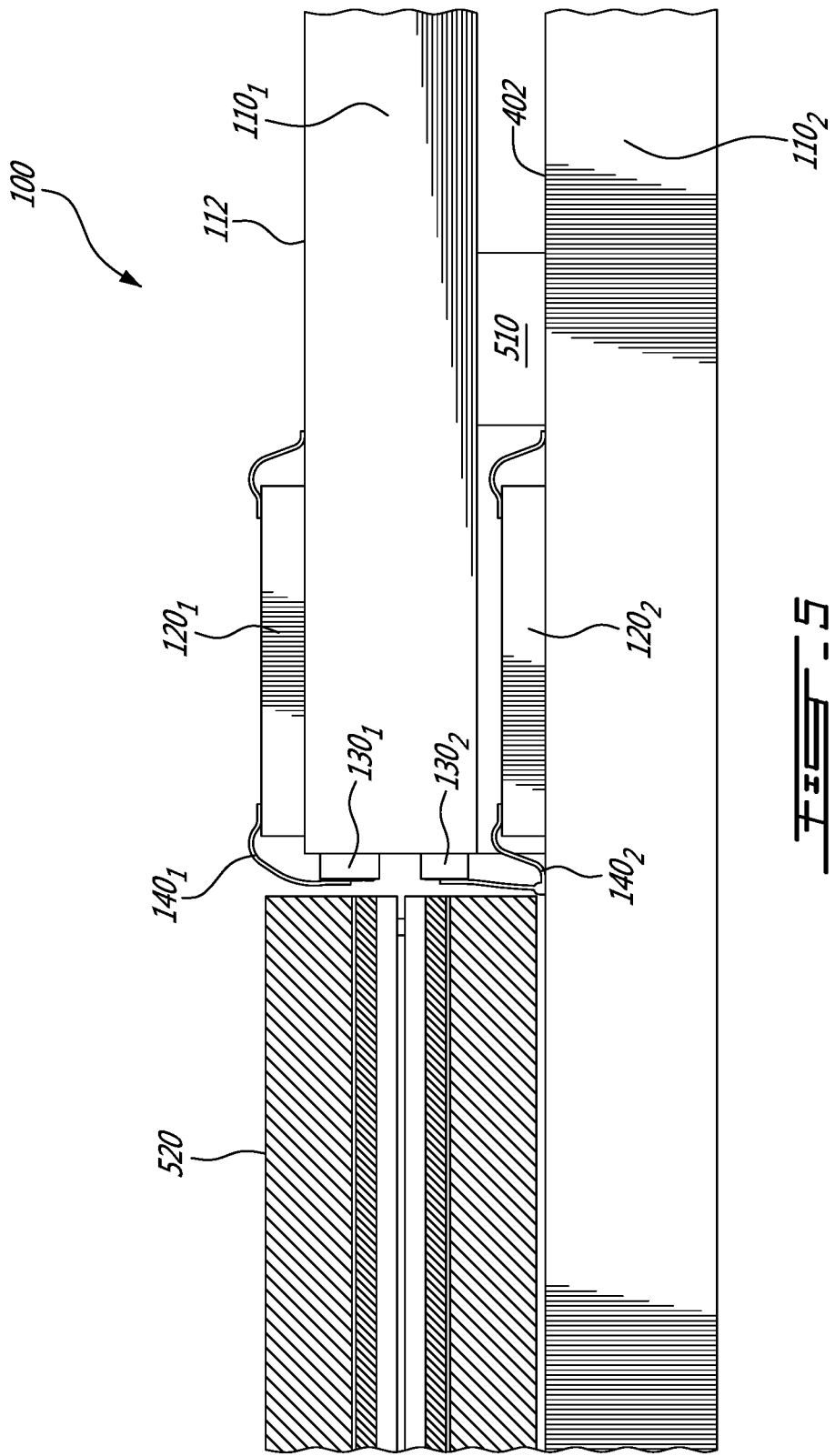
FIG. 5 illustrates an example two-row optical engine.

With reference to FIG. 5, in certain embodiments the optical engine 100 includes a plurality of integrated circuits $120_{1,2}$ which are positioned on respective substrate blocks $110_{1,2}$. Each of the integrated circuits $120_{1,2}$ may be coupled to a respective set of optoelectronic components $130_{1,2}$ via respective wirebonds $140_{1,2}$. In certain embodiments, the substrate blocks $110_{1,2}$ are separated by a spacer 510. Additionally, the second integrated circuit $120_2$ may be mounted on a first surface 502 of the second substrate block $110_2$. In some such embodiments, only one set of the optoelectronic components, for example optoelectronic components 130, are electrically coupled to an integrated circuit, for example integrated circuit $120_1$, via the wirebonding method 300 described hereinabove. The optical engine 100 can emit light to or detect light from a connector 520.

Figure 6A:
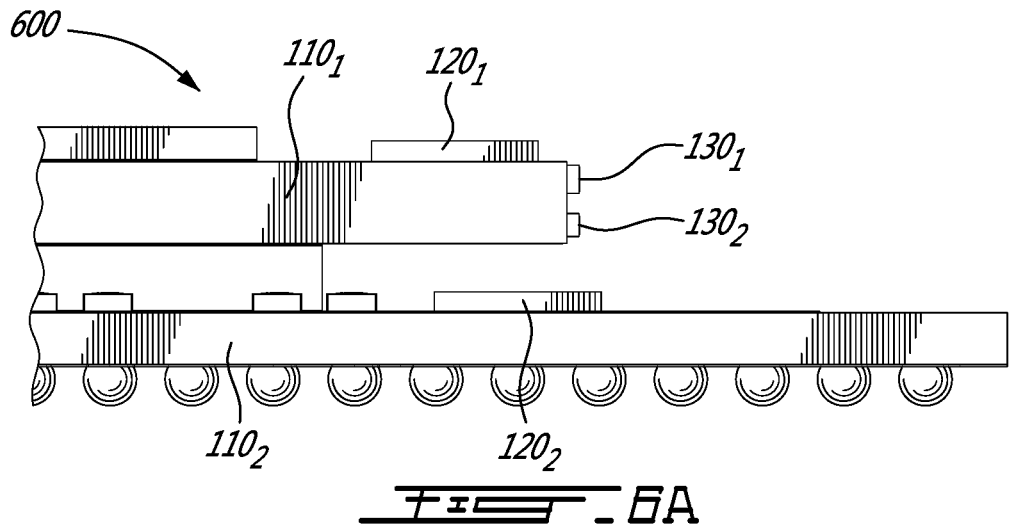
FIGS. 6A-G are side-views of an optical engine with multiple optoelectronic components showing example steps of the method of FIG. 3.
Figure 6B:
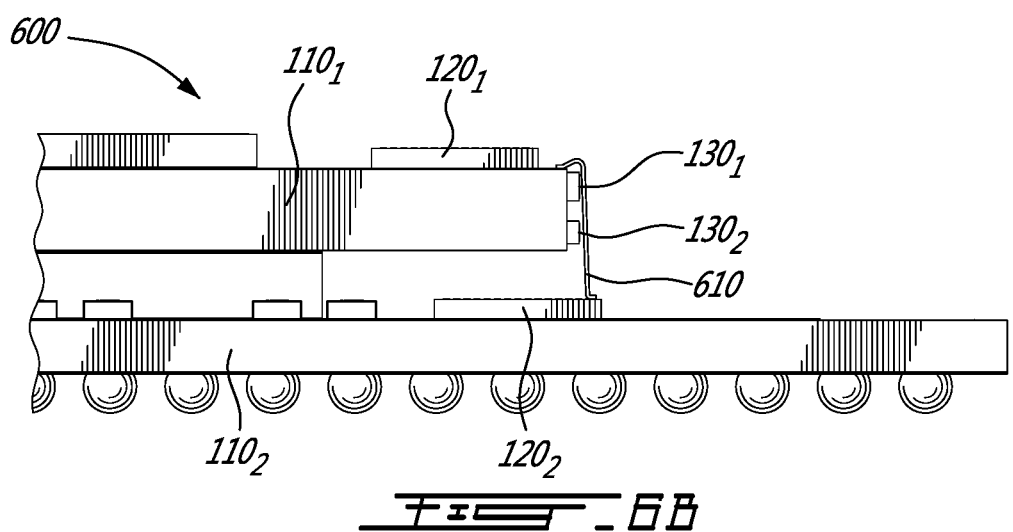
Figure 6C:
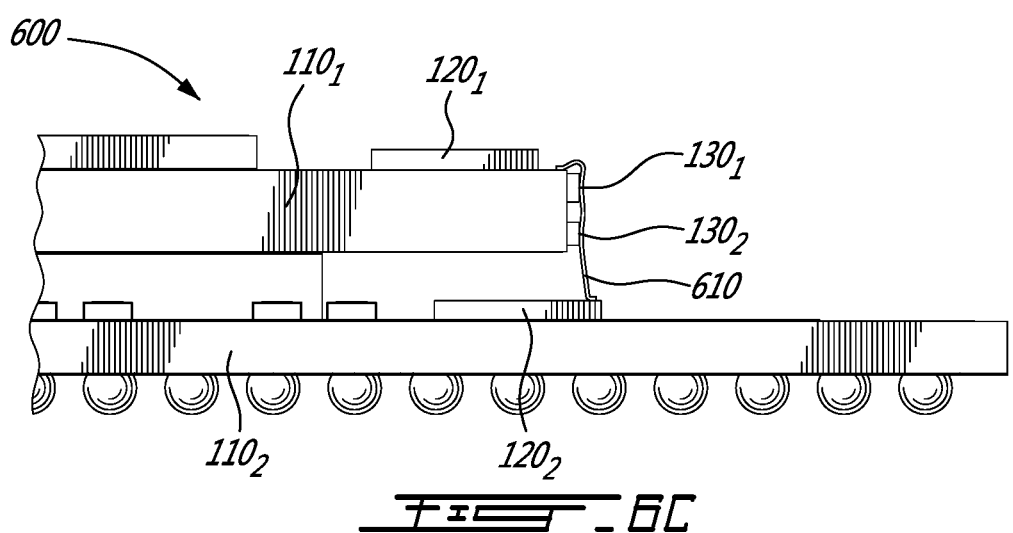
Figure 6D:
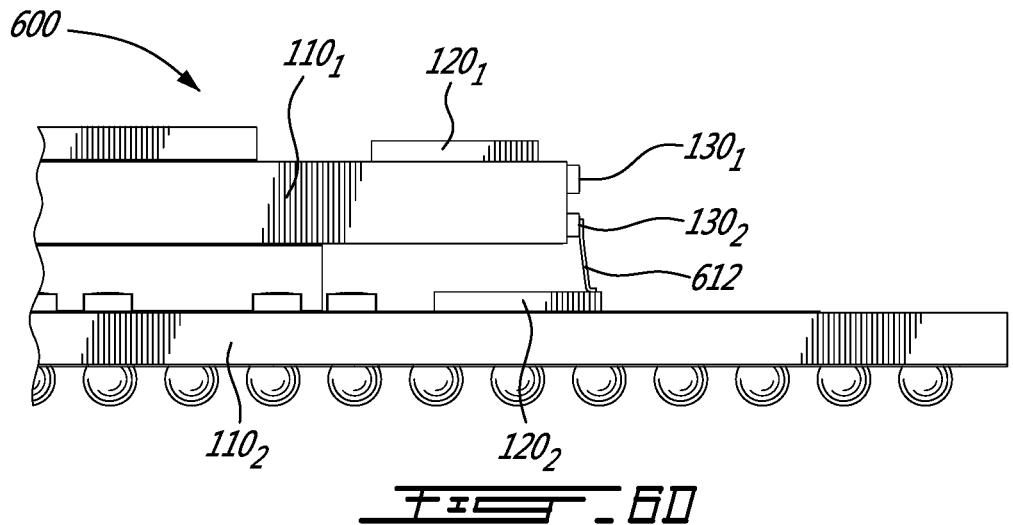

Thus, and with reference to FIGS. 6A-G, the method 300 can be applied in succession for embodiments of the optical engine 100 that have more than one optoelectronic component 130. In FIG. 6A, a two-row optical engine 600 is shown, having first and second substrates $110_{1,2}$, first and second integrated circuits $120_{1,2}$, and first and second optoelectronic components $130_{1,2}$. As shown in FIG. 6B, a first wirebond 610 is drawn between the first substrate $110_1$ and the second integrated circuit $110_2$, as per step 306. In this embodiment, the first substrate $110_1$ serves as a base substrate. The wirebond 610 can be drawn from the first substrate $110_1$ to the second integrated circuit $110_2$, or vice-versa. As shown in FIG. 6C, the second optoelectronic component $130_2$ is contacted with the wirebond 610 at a point intermediate the first and second ends of the wirebond 610, as per step 308. As shown in FIG. 6D, the portion of the wirebond 610 between the second optoelectronic component $130_2$ and the first substrate $110_1$ is removed, as per step 310. This leaves wirebond 612 coupling the second optoelectronic component $130_2$ and the second integrated circuit $120_2$.

Figure 6E:
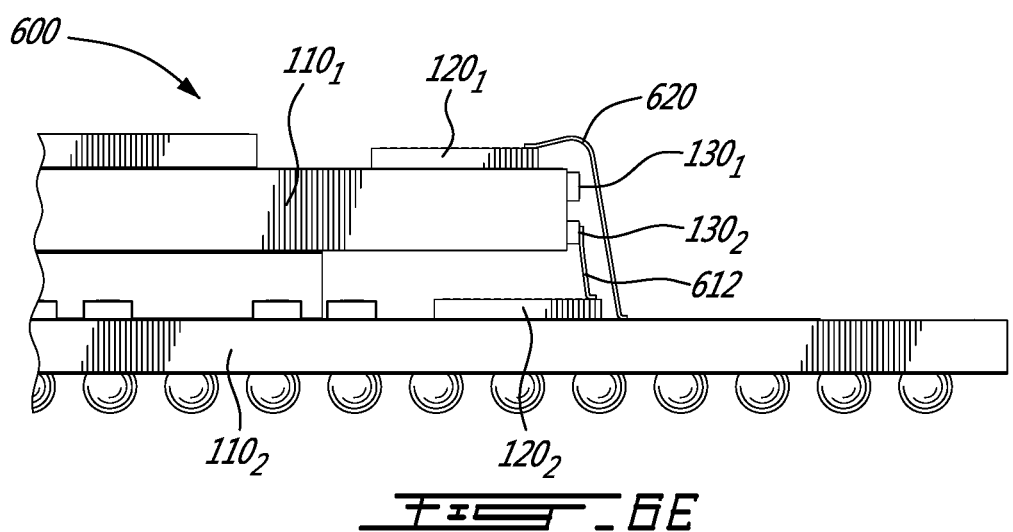
Figure 6F:
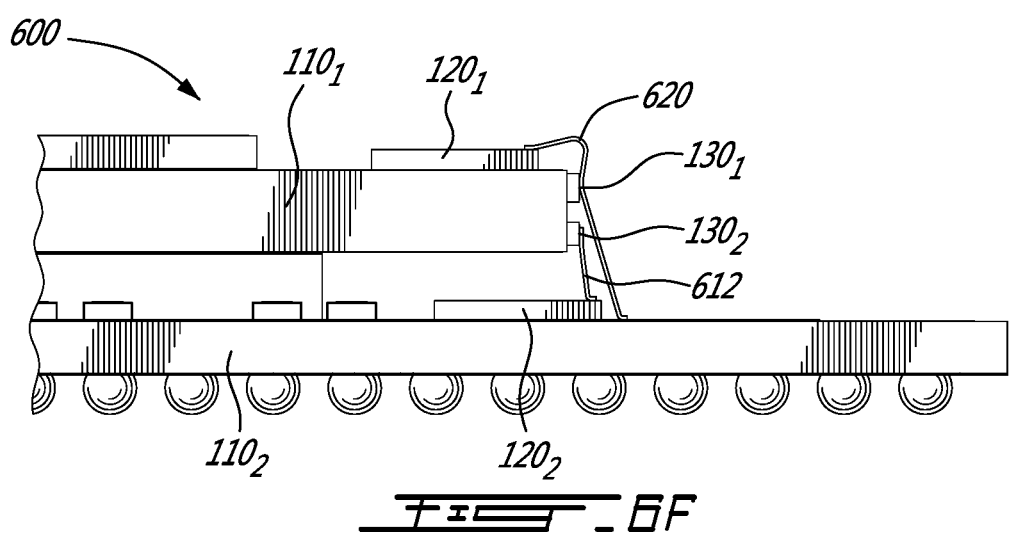
Figure 6G:
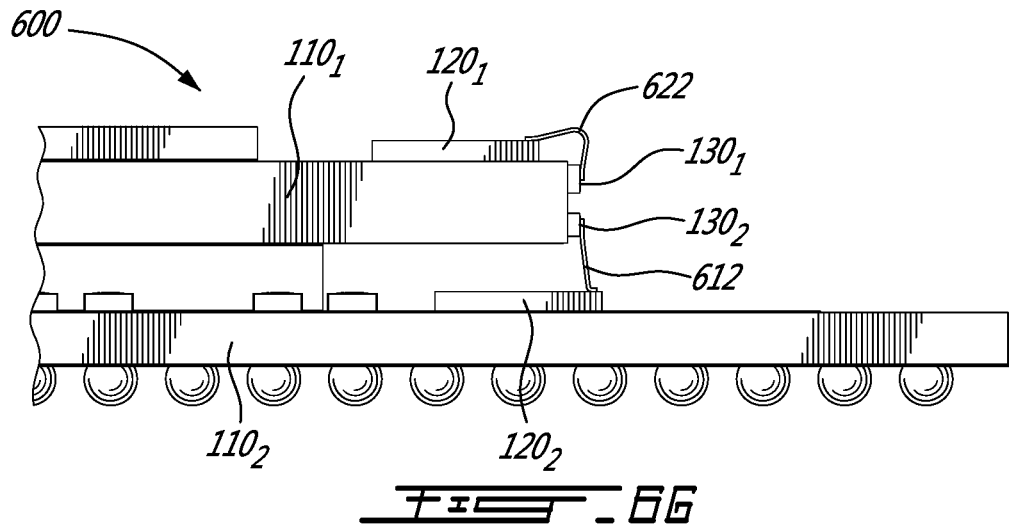

With reference to FIG. 6E, to couple the first optoelectronic component $130_1$ with the first integrate circuit $120_1$, a second wirebond 620 is drawn between the second substrate $110_2$ and the first integrated circuit $110_1$, as per step 306. In this embodiment, the second substrate $110_2$ serves as a base substrate. The wirebond 620 can be drawn from the second substrate $110_2$ to the first integrated circuit $110_1$, or vice-versa. As shown in FIG. 6F, the first optoelectronic component $130_1$ is contacted with the wirebond 620 at a point intermediate the first and second ends of the wirebond 620, as per step 308. As shown in FIG. 6G, the portion of the wirebond 620 between the first optoelectronic component $130_1$ and the second substrate $110_2$ is removed, as per step 310. This leaves wirebond 622 coupling the first optoelectronic component $130_1$ and the first integrated circuit $120_1$.

Figure 7:
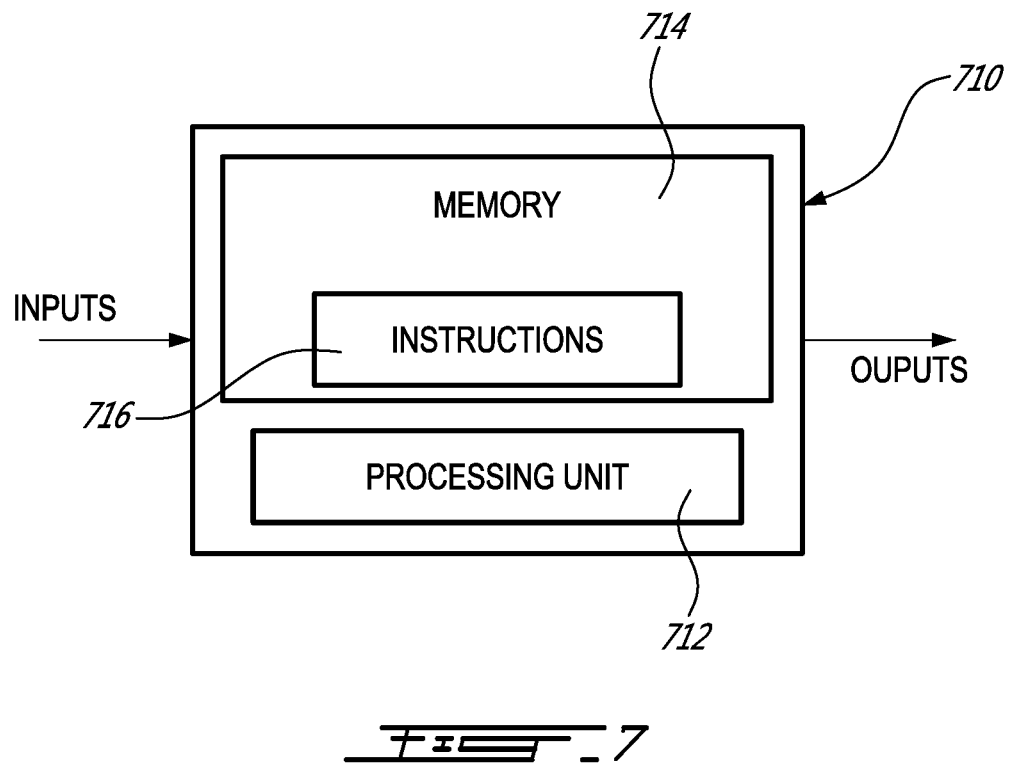
FIG. 7 is a block diagram of an example computer system for implementing the method of FIG. 3.

With reference to FIG. 7, the method 300 may be implemented by a computing device 710, comprising a processing unit 712 and a memory 714 which has stored therein computer-executable instructions 716. For example, the computing device 710 can be used to control the operation of a wirebonding machine, wirebonding robot, and/or any other suitable wirebonding tool which can be used to perform the method 300. In some embodiments, the computing device 710 is used to control a wirebonding machine having one or more arms or other movable elements which can perform a wirebonding process, including the method 300, by way of one or more wirebonders, for example the wirebonder 400. Alternatively, or in addition, the computing device 710 can be used to control a machine for mounting the integrated circuit 120 on the substrate block $110_1$ and/or for positioning the laser component(s) 130 on the substrate block $110_1$. In some embodiments, the computing device 710 controls separate machines or robots for performing the mounting/positioning of steps 302, 304 and for performing the wirebonding of steps 306, 308, and 310. In other embodiments, a common machine or robot can be controlled to perform all steps of the method 300. In one example embodiment, the computing device 710 controls a fully automatic wedge wirebond machine used for microchip packaging, such as the Hesse Mechatronics BJ820™. Other similar machines may also be used. It should be noted that the wirebonding discussed herein can incorporate heat-based welding, ultrasonic vibrational welding, or any other suitable type of welding, as appropriate.

With reference to FIG. 8, there is shown an example optical fiber coupler 800. In some embodiments, the optical fiber coupler 800 is configured for being connected to the optical engine 100 and/or the two-row optical engine 600 in order to carry light to or from the optoelectronic components 130, $130_1$, $130_2$. The optical fiber coupler 800 has a main body 810 which can be made of any suitable type of plastic, polymer, or resin, including polyethylene, polyurethane, and the like. The optical fiber coupler 800 also houses a plurality of optical fibers 820 which run along a longitudinal axis of the optical fiber coupler 800.

The main body 810 of the optical fiber coupler 800 includes upper and lower planar surfaces 802, 804 and a front face 806 which is disposed between the upper and lower surfaces 802, 804. The front face 806 is also provided with a plurality of apertures 812, and the optical fibers 820 extend toward the front face 806 of the optical fiber coupler 800 and to apertures 812 in the front face 806. In addition, the main body 810 of the optical fiber coupler 800 includes a chamfer surface 808 which extends between the upper surface 802 and the front face 806. The chamfer surface 808 provides a line-of-sight from the upper planar surface 802 to the front face 806. The chamfer surface can be at any suitable angle with respect to the upper surface 802, including 60°, 45°, 30°, 15°, or any other suitable angle. In some embodiments, the main body 810 also includes a second chamfer surface 809, which extends between the lower surface 804 and the front face 806, which can be at any suitable angle with respect to the lower surface 804. The second chamfer surface can provide a line-of-sight from the lower planar surface 804 to the front face 806. Additionally, although the main body 810 of the optical fiber coupler 800 includes the chamfer surface 809, for example at 45-degrees relative to the front face 806, tips 822 of the optical fibers 820 proximal to the front face 806 are themselves not chamfered. In some embodiments, the tips of the optical fibers 820 are co-planar with front face 806.

The front face 806 of the optical fiber coupler 800 can include any number of apertures 812, and the apertures 812 can be organized in any suitable fashion. In the example of FIG. 8, the front face 806 has twenty-four (24) apertures, which are arranged in two rows of twelve (12) apertures. In other examples, the apertures 812 can be arranged in a single row, in three or more rows, in two sets of two rows, or according to any other suitable pattern.

With reference to FIGS. 9A-B, in some cases, the optical engines assembled using the method 300, for example the optical engine 100 and the two-row optical engine 600, can be used to form part of a larger optical system assembly. FIGS. 9A and 9B illustrate embodiments of the coupling of the optoelectronic components $130_1$, $130_2$ to the optical fiber coupler 800. Similar approaches can be used for the optical engine 100, for example using a different type or design of optical fiber coupler.

In the example of FIG. 9A, light emitted from the optoelectronic components $130_1$, $130_2$ is directly input into the optical fiber coupler 800. Proper alignment of the optoelectronic components $130_1$, $130_2$ to the optical fiber coupler 800 is required in order to ensure that all of the light gets coupled and that there are no losses. For example, a front surface of the optoelectronic components $130_1$, $130_2$ is substantially parallel with a surface formed by the front face 806 of the optical fiber coupler 800. Alignment is facilitated using the method 300 as the area directly in front of the optoelectronic components $130_1$, $130_2$ is not encumbered by the wirebonds. In the example of FIG. 9B, a lens array 900 is inserted between the optoelectronic components $130_1$, $130_2$ and the optical fiber coupler 800. Light emitted from the optoelectronic components $130_1$, $130_2$ is focused into the optical fiber coupler 800 by the lens array 900. The optoelectronic components $130_1$, $130_2$ are positioned so as to emit light in a direction that is parallel to the surface of the substrate $110_1$, and method 300 for electrically coupling the optoelectronic components $130_1$, $130_2$ to the integrated circuits $120_1$, $120_2$ provides enough space in front of the optoelectronic components $130_1$, $130_2$ to accommodate for the wirebonds themselves.

In some embodiments, the beveled nature of the optical fiber coupler 800, for example as illustrated in FIGS. 9A and 9B, can assist with the avoidance of the wirebonds 140, $140_1$, $140_2$, 450, 612, 622, or any other wirebond which forms part of the optical engine 100 or the two-row optical engine 600. In addition, the beveled portions of the optical fiber coupler 800 can provide clearance for a camera, assisted viewing system, computer vision system, or other similar device which can be used to assist in alignment of the optical engine 100 (or the two-row optical engine 600) with the optical fiber coupler 800. For example, the camera system can be positioned on a side of the optical fiber coupler 800 and angled so that the camera system can capture a portion of the optical engine 100, for example some or all of the optoelectronic components 130, $130_1$, $130_2$, and part or all of fiber tips of the optical fiber coupler 800, which can extend from the apertures 812. The camera system can thus be used to provide feedback to a computerized alignment system which serves to attach the optical fiber coupler 800 to the optical engine 100 or the two-row optical engine 600.

Various aspects of the optical engines, wirebonding techniques, and optical systems disclosed herein may be used alone, in combination, or in a variety of arrangements not specifically discussed in the embodiments described in the foregoing and are therefore not limited in their application to the details and arrangement of components set forth in the foregoing description or illustrated in the drawings. For example, aspects described in one embodiment may be combined in any manner with aspects described in other embodiments. Although particular embodiments have been shown and described, it will be obvious to those skilled in the art that changes and modifications may be made without departing from this invention in its broader aspects. The scope of the following claims should not be limited by the preferred embodiments set forth in the examples, but should be given the broadest reasonable interpretation consistent with the description as a whole.

What is claimed is:

1. A method for electrically coupling an optoelectronic component to an integrated circuit mounted on a first surface of a substrate block, comprising:
   drawing a wirebond between the integrated circuit and a base substrate on which the substrate block is mounted, the wirebond having a first end at the integrated circuit and a second end at the base substrate;
   contacting the optoelectronic component, positioned on a second surface of the substrate block, with the wirebond at a point intermediate the first and second ends of the wirebond, the second surface being adjacent to the first surface, the optoelectronic component oriented to emit light in a direction parallel to a plane defined by the first surface; and
   removing a portion of the wirebond between the optoelectronic component and the base substrate.

2. The method of claim 1, further comprising positioning the optoelectronic component on the second surface of the substrate block.

3. The method of claim 1, wherein contacting the optoelectronic component comprises heating the wirebond to couple the wirebond to the optoelectronic component.

4. The method of claim 1, wherein contacting the optoelectronic component comprises performing ultrasonic vibrational welding to couple the wirebond to the optoelectronic component.

5. The method of claim 1, wherein contacting the optoelectronic component comprises compressing the wirebond into a contact pad of the optoelectronic component to couple the wirebond to the optoelectronic component.

6. The method of claim 1, wherein removing the wirebond portion comprises forcibly breaking the wirebond portion by applying a mechanical force to the wirebond portion.

7. The method of claim 6, wherein applying a mechanical force to the wirebond portion comprises cutting the wirebond portion.

8. The method of claim 1, wherein positioning the optoelectronic component further comprises bonding the optoelectronic component to the substrate.

\* \* \* \* \*